(12) United States Patent
An (10) Patent No.: US 8,570,794 B2
(45) Date of Patent: *Oct. 29, 2013

(54) SEMICONDUCTOR MEMORY APPARATUS (75) Inventor: Yong Bok An, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 185 days.

This patent is subject to a terminal disclaimer.

(21) Appl. No.: 12/982,961

(22) Filed: Dec. 31, 2010

(65) Prior Publication Data

US 2011/0261611 A1    Oct. 27, 2011

(30) Foreign Application Priority Data

Apr. 26, 2010   (KR) .................. 10-2010-0038324

(51) Int. Cl.
*G11C 11/00* (2006.01)

(52) U.S. Cl.
USPC .......................................... 365/163; 365/189

(58) Field of Classification Search
USPC ................... 365/163, 189.14, 189.16
See application file for complete search history.

(56) References Cited

U.S. PATENT DOCUMENTS

| | | | |
|---|---|---|---|
| 2005/0030828 A1 | 2/2005 | Tanaka | |
| 2007/0268762 A1* | 11/2007 | Mori | 365/201 |
| 2008/0151625 A1 | 6/2008 | Mitani et al. | |
| 2009/0129140 A1 | 5/2009 | Kawazoe et al. | |
| 2011/0261612 A1* | 10/2011 | An | 365/163 |
| 2012/0081953 A1* | 4/2012 | An | 365/163 |

FOREIGN PATENT DOCUMENTS

| | | |
|---|---|---|
| JP | 11-031391 | 2/1999 |
| JP | 2008-270937 | 11/2008 |
| KR | 1020040075033 A | 8/2004 |
| KR | 1020050120485 A | 12/2005 |
| KR | 100773095 B1 | 10/2007 |
| KR | 1020080081656 A | 9/2008 |

* cited by examiner

*Primary Examiner* — Vu Le
(74) *Attorney, Agent, or Firm* — William Park & Associates Patent Ltd.

(57) ABSTRACT

A semiconductor memory apparatus includes a period control signal generation unit configured to generate a period control signal which is activated after a first time, in response to a programming enable signal, a first write control code generation unit configured to generate first write control codes which are cyclically updated for a second time, in response to the programming enable signal, and update the first write control codes in response to the period control signal, a second write control code generation unit configured to generate a second write control code in response to the programming enable signal, and a data write unit configured to output a first programming current pulse which has a magnitude corresponding to a code combination of the updated first write control codes or a second programming current pulse which has a magnitude corresponding to the second write control code.

16 Claims, 12 Drawing Sheets

SEMICONDUCTOR MEMORY APPARATUS

CROSS-REFERENCES TO RELATED APPLICATION

The present application claims priority under 35 U.S.C. §119(a) to Korean application number 10-2010-0038324, filed on Apr. 26, 2010, in the Korean Intellectual Property Office, which is incorporated herein by reference in its entirety.

BACKGROUND

1. Technical Field

The present invention relates to a semiconductor memory apparatus, and more particularly, to a technology for generating a programming current pulse.

2. Related Art

A phase change random access memory (PCRAM) is a non-volatile memory apparatus which programs a memory cell through a programming current pulse.

A PCRAM has a characteristic of a non-volatile memory and may achieve a random access. Also, the PCRAM may be highly integrated at a low cost. The PCRAM stores data by using a phase change material. Specifically, the PCRAM stores data by using a phase change of a phase change material according to a temperature condition, that is, a change in a resistance value according to a phase change.

A phase change material can change to an amorphous state or a crystalline state according to a temperature condition. A representative phase change material is a chalcogenide alloy. A representative chalcogenide alloy is $Ge_2Sb_2Te_5$ composed of germanium (Ge), antimony (Sb), and tellurium (Te). Hence, a phase change material is generally called a "GST".

A PCRAM causes a reversible phase change of a phase change material (GST) between a crystalline state and an amorphous state by using Joule heating generated when a current is applied to the phase change material (GST) under certain conditions. In a known art, the crystalline state is referred to as a set state. In the set state, the phase change material (GST) has a small resistance value. Also, the amorphous state is referred to as a reset state. In the reset state, the phase change material (GST) has a larger resistance value than that in the set state. That is to say, the PCRAM stores data through a change in a resistance value between the crystalline state and the amorphous state, and determines a level of the stored data by sensing a current flowing through the phase change material (GST) or a voltage change depending on a current change. In the known art, the set state is defined as a logic level of '0', and the reset state is defined as a logic level of '1'. A state of the phase change material (GST) may be continuously maintained even though power is interrupted.

Meanwhile, the amorphous state and the crystalline state of the phase change material (GST) may be mutually changed by a programming current pulse. A set programming current pulse is a programming current which changes the phase change material (GST) of a memory cell to the set state, and a reset programming current pulse is a programming current which changes the phase change material (GST) of the memory cell to the reset state.

As the phase change material (GST) is rapidly cooled after being heated to, for example, a temperature higher than a melting temperature for a certain time by the supply of the reset programming current pulse, the phase change material (GST) is changed to the amorphous state. Also, as the phase change material (GST) is slowly cooled after being heated to, for example, a temperature higher than a crystallization temperature and lower than the melting temperature for a certain time by the supply of the set programming current pulse, the phase change material (GST) is changed to the crystalline state. Meanwhile, because a resistance value can vary depending upon a ratio of an amorphous volume to a crystalline volume of the phase change material (GST), a memory cell can be configured in a multi-level form. In the known art, a large current is flowed as the reset programming current pulse for a time shorter than the set programming current pulse, and a small current is flowed as the set programming current pulse for a time longer than the reset programming current pulse. That is to say, the state of the phase change material (GST) is changed by Joule heating under a certain condition, which is generated due to the supply of the programming current pulse.

Figure 1:
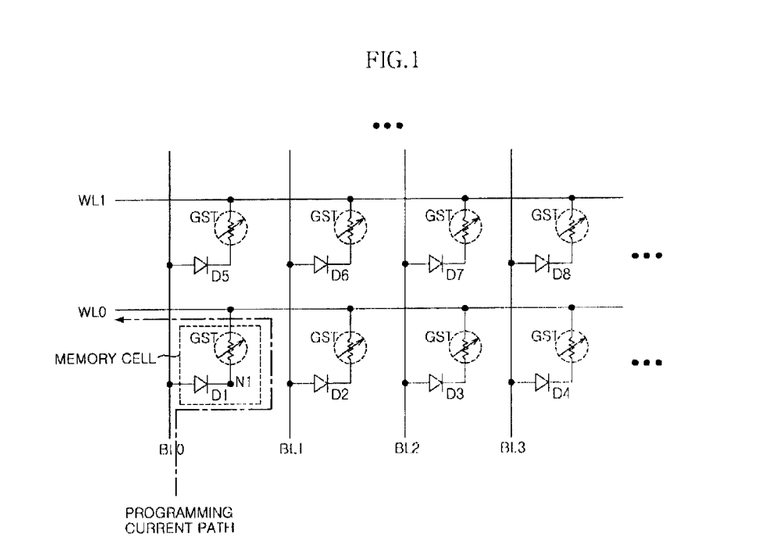
FIG. 1 is a diagram illustrating a memory cell of a known PCRAM.

FIG. 1 is a diagram illustrating a memory cell of a known PCRAM.

Referring to FIG. 1, a memory cell includes a cell diode D1 and a phase change element GST.

An example of the basic operations of the PCRAM configured as mentioned above will be described below.

First, an operation for programming data to the phase change element GST is performed as follows.

When a word line WL is activated to a low level, e.g., a ground voltage, and a certain voltage for a program operation begins to be applied through a bit line BL, since a cell diode D1 becomes a forward biased state, the cell diode D1 is turned on from when a voltage difference between the anode and the cathode of the cell diode D1 is higher than a threshold voltage. As a result, a current path for the program operation is formed among the bit line BL, the phase change element GST, and the word line WL. Therefore, by supplying a programming current pulse corresponding to data to be programmed to the phase change element GST through the bit line BL, the phase change element GST can be changed to the crystalline state or the amorphous state. Here, if the data to be programmed has a logic level of '1', the phase change element GST may be changed to a reset state by supplying a reset programming current pulse, and if the data to be programmed has a logic level of '0', the phase change element GST may be changed to a set state by supplying a set programming current pulse. As mentioned above, the reset state as the amorphous state has a larger resistance value than the set state as the crystalline state.

Also, an operation for detecting the data programmed to the phase change element GST is performed as follows.

When the word line WL is activated to the low level, e.g., the ground voltage, and a certain voltage for a read or a verification operation ("a read operation") begins to be applied through the bit line BL, since the cell diode D1 becomes the forward biased state, the cell diode D1 is turned on from when the voltage difference between the anode and the cathode of the cell diode D1 is higher than the threshold voltage. As a result, a current path for the read operation is formed among the bit line BL, the phase change element GST, and the word line WL. Therefore, when a certain voltage or a certain current for the read operation is applied to the phase change element GST through the bit line BL, an amount of current flowing through the phase change element GST or the magnitude of a voltage drop in the phase change element GST varies depending upon the resistance value of the phase change element GST. Therefore, data stored in the phase change element GST is discriminated.

Figure 2:
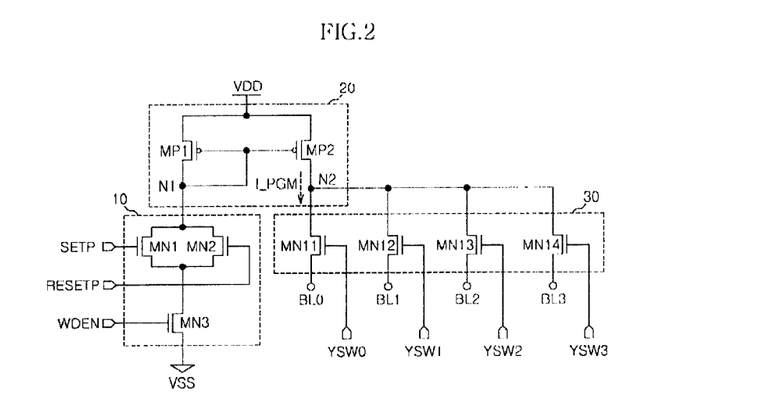
FIG. 2 is a configuration diagram of a data write unit of the known PCRAM.

FIG. 2 is a configuration diagram of a data write unit of the a known PCRAM.

Referring to FIG. 2, a data write unit includes a current control section 10, a current driving section 20, and a selection section 30.

The current control section 10 is configured to control a voltage level of a control node N1 in response to a set control signal SETP and a reset control signal RESETP when a write enable signal WDEN is activated. Current driving forces of an NMOS transistor MN1 controlled by the set control signal SETP and an NMOS transistor MN2 controlled by the reset control signal RESETP may be designed to be different from each other. The set control signal SETP and the reset control signal RESETP may be inputted in a pulse type.

The current driving section 20 is configured to drive a programming current pulse I_PGM with a magnitude corresponding to the voltage level of the node N1, to an output terminal N2. The in programming current pulse I_PGM can be classified into a set programming current pulse corresponding to the set control signal SETP and a reset programming current pulse corresponding to the reset control signal RESETP.

The selection section 30 is configured to output the programming current pulse I_PGM, driven from the current driving section 20, to bit lines BL0 through BL3 which respectively correspond to a plurality of select signals YSW<0:3>.

Figure 3:
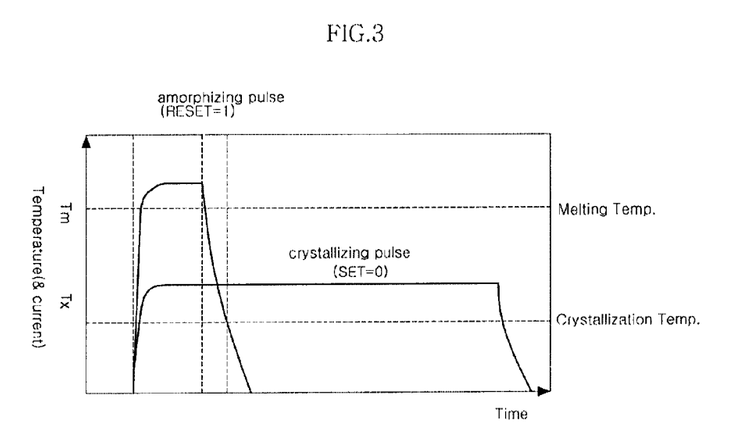
FIG. 3 is a graph showing programming current pulses which are outputted from the data write unit of FIG. 2.

FIG. 3 is a graph showing programming current pulses which are outputted from the data write unit of FIG. 2.

Referring to FIG. 3, it is to be appreciated that a reset programming current pulse is driven for a short time to be higher than a melting temperature and a set programming current pulse is driven for a long time when compared to the reset programming current pulse, to be lower than the melting temperature. For reference, in the drawing, the reset programming current pulse is shown as an amorphizing pulse, and the set programming pulse is shown as a crystallizing pulse.

SUMMARY

In an exemplary embodiment of the present invention, a semiconductor memory apparatus includes a period control signal generation unit configured to generate a period control signal which is activated after a first time, in response to a programming enable signal, a first write control code generation unit configured to generate first write control codes which are cyclically updated for a second time, in response to the programming enable signal, and update the first write control codes in response to the period control signal, a second write control code generation unit configured to generate a second write control code in response to the programming enable signal, and a data write unit configured to output a first programming current pulse which has a magnitude corresponding to a code combination of the updated first write control codes or a second programming current pulse which has a magnitude corresponding to the second write control code.

In another exemplary embodiment of the present invention, a semiconductor memory apparatus includes a configuration code output unit configured to output configuration codes; a period control signal generation unit configured to generate a period control signal which is activated after a first time corresponding to the configuration codes, in response to a programming enable signal, a first write control code generation unit configured to generate first write control codes which are cyclically updated for a second time, in response to the programming enable signal, and update the first write control codes in response to the period control signal, a second write control code generation unit configured to generate a second write control code in response to the programming enable signal; and a data write unit configured to output a first programming current pulse which has a magnitude corresponding to a code combination of the updated first write control codes or a second programming current pulse which has to a magnitude corresponding to the second write control code.

In yet another exemplary embodiment of the present invention, a semiconductor memory apparatus includes a data write unit configured to output a first programming current which has a first period of supplying the largest first programming current, and a second period of supplying a decreasing first programming current, a period control signal generation unit configured to generate a period control signal which control a duration of the first period, and a first write control code generation unit configured to generate a first programming control code which control the first programming current.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through exemplary embodiments.

For reference, since terms, symbols and signs that are used in drawings and in this detailed description to designate devices, blocks, and so on may be used for detailed units as the occasion demands, it is to be noted that the same terms, symbols and signs may not designate the same devices, blocks, and so on in an entire circuitry.

Figure 4:
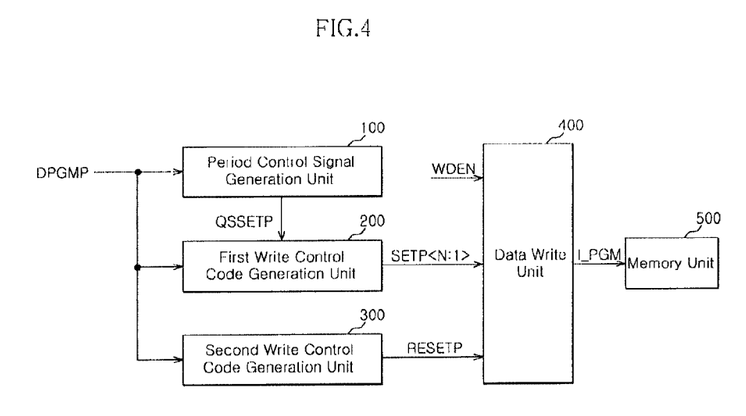
FIG. 4 is a configuration diagram illustrating a semiconductor memory apparatus in accordance with an exemplary embodiment of the present invention.

FIG. 4 is a configuration diagram illustrating a semiconductor memory apparatus in accordance with an exemplary embodiment of the present invention.

The semiconductor memory apparatus in accordance with the present exemplary embodiment of the invention includes only a simplified configuration for the sake of clear description of essential characteristics.

Referring to FIG. 4, a semiconductor memory apparatus includes a period control signal generation unit 100, a first write control code generation unit 200, a second write control code generation unit 300, and a data write unit 400.

The principal operations of the semiconductor memory apparatus configured as mentioned above will be described below.

The period control signal generation unit 100 is configured to generate a period control signal QSSETP which is activated after a first time, in response to a programming enable signal DPGMP. That is to say, the period control signal QSSETP is activated after the first time from an activation timing of the programming enable signal DPGMP.

The first write control code generation unit 200 is configured to generate first write control codes SETP<N:1> which are cyclically updated for a second preset time, in response to the programming enable signal DPGMP. The first write control code generation unit 200 activates a function for the update of the first write control codes SETP<N:1> when the period control signal QSSETP is activated.

The second write control code generation unit 300 is configured to generate a second write control code RESETP which is activated for a certain time, in response to the programming enable signal DPGMP.

The data write unit 400 is configured to output a programming current pulse I_PGM which has a magnitude corresponding to a code combination of the updated first write control codes SETP<N:1> or a magnitude corresponding to the second write control code RESETP. The programming current pulse I_PGM can be classified into a first programming current pulse corresponding to the first write control codes SETP<N:1> or a second programming current pulse corresponding to the second write control code RESETP. The programming current pulse I_PGM outputted from the data write unit 400 is transferred to a memory unit 500 and is supplied to a corresponding memory cell selected among a plurality of memory cells.

Figure 5:
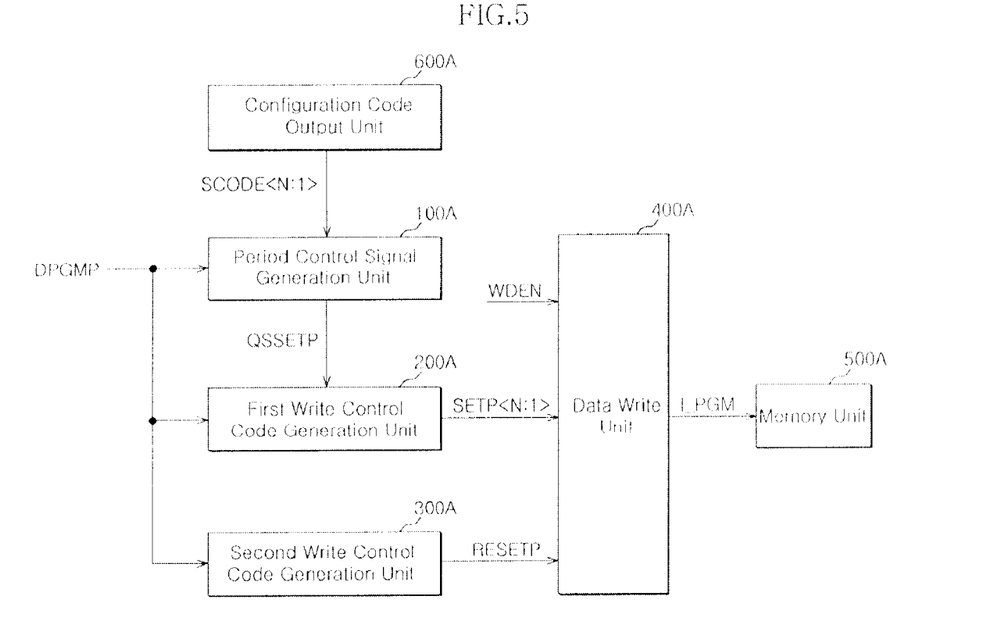
FIG. 5 is a configuration diagram illustrating a semiconductor memory apparatus in accordance with another exemplary embodiment of the present invention.

FIG. 5 is a configuration diagram illustrating a semiconductor memory apparatus in accordance with another exemplary embodiment of the present invention.

The semiconductor memory apparatus in accordance with the present embodiment of the invention includes only a simplified configuration for the sake of clear description of essential characteristics.

Referring to FIG. 5, a semiconductor memory apparatus includes a configuration code output unit 600A, a period control signal generation unit 100A, a first write control code generation unit 200A, a second write control code generation unit 300A, and a data write unit 400A.

The detailed configuration and operations of the semiconductor memory apparatus configured as mentioned above will be described below.

The configuration code output unit 600A is configured to output configuration codes SCODE<N:1>. The configuration codes SCODE<N:1> may be defined as codes which are stored in a mode register set (MRS). The configuration codes SCODE<N:1> may be defined as codes which are stored in a fuse set or a latch unit.

The period control signal generation unit 100A is configured to generate a period control signal QSSETP which corresponds to the configuration codes SCODE<N:1> and is activated after a first time, in response to a programming enable signal DPGMP. That is to say, the period control signal QSSETP is activated after the first time from an activation timing of the programming enable signal DPGMP. Therefore, the first time may be a duration for applying an initial "set" current which is the largest current of the "set" current.

The first write control code generation unit 200A is configured to generate first write control codes SETP<N:1> which are cyclically updated for a second preset time, in response to the programming enable signal DPGMP. The first write control code generation unit 200A activates a function for the update of the first write control codes SETP<N:1> when the period control signal QSSETP is activated.

The second write control code generation unit 300A is configured to generate a second write control code RESETP which is activated for a certain time, in response to the programming enable signal DPGMP.

The data write unit 400A is configured to output a programming current pulse I_PGM which has a magnitude corresponding to a code combination of the updated first write control codes SETP<N:1> or a magnitude corresponding to the second write control code RESETP. The programming current pulse I_PGM can be classified into a first programming current pulse corresponding to the first write control codes SETP<N:1> or a second programming current pulse corresponding to the second write control code RESETP. The programming current pulse I_PGM outputted from the data write unit 400A is transferred to a memory unit 500A and is supplied to a corresponding memory cell selected among a plurality of memory cells.

Figure 6A:
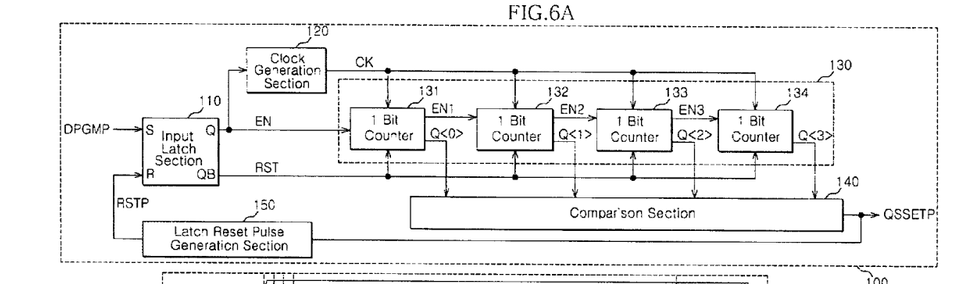
FIGS. 6A and 6B are configuration diagrams illustrating exemplary embodiments of a period control signal generation unit and a timing diagram illustrating internal operations of the period control signal generation unit.
Figure 6B:
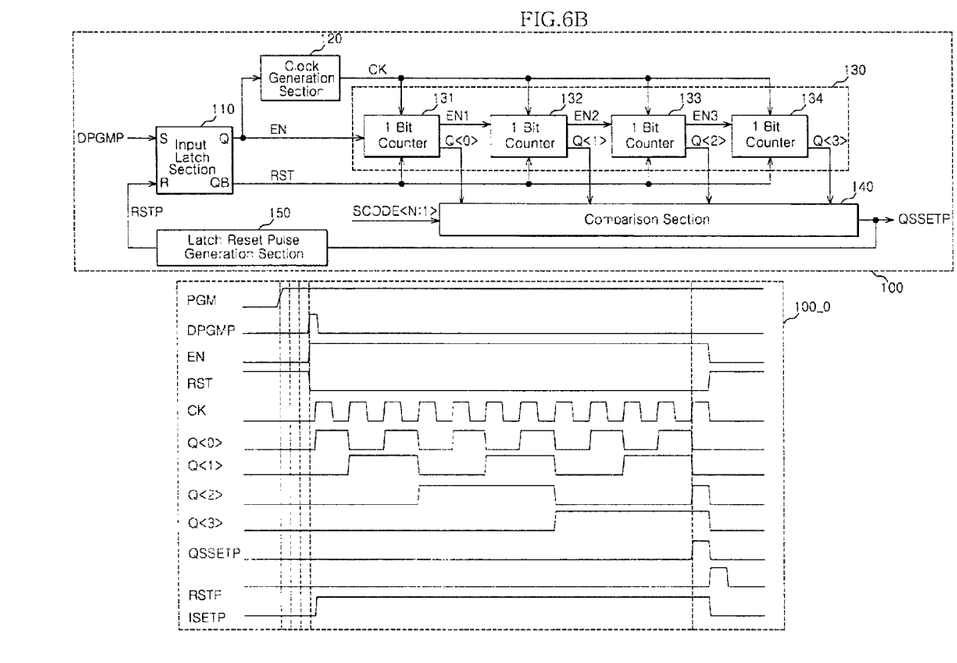

FIGS. 6A and 6B are configuration diagrams illustrating an exemplary embodiment of the period control signal generation unit and a timing diagram illustrating internal operations of the period control signal generation unit.

Referring to FIG. 6A, the period control signal generation unit 100 includes an input latch section 110, a clock generation section 120, a counter section 130, a comparison section 140, and a latch reset pulse generation section 150.

Operations of the period control signal generation unit 100 configured as mentioned above will be described below with reference to a diagram 100_0.

The input latch section 110 is configured to output a count enable signal EN and a counter reset signal RST in response to the programming enable signal DPGMP and a latch reset pulse signal RSTP. In other words, the count enable signal EN is activated to a high level when the programming enable signal DPGMP pulses to a high level, and the counter reset signal RST is activated to a high level when the latch reset pulse signal RSTP pulses to a high level.

The clock generation section 120 is configured to generate a clock signal CK in response to the count enable signal EN. Namely, the clock generation section 120 generates the clock signal CK which toggles while the count enable signal EN is activated to the high level.

The counter section 130 is configured to output count codes Q<0:3> which are counted under the control of the count enable signal EN, the counter reset signal RST and the clock signal CK. That is to say, the counter section 130 performs a counting operation in response to the clock signal CK when the count enable signal EN is activated to the high level. If the counter reset signal RST is activated to the high level, the counting codes Q<0:3> which are outputted from the counter section 130 are initialized. In the case where the counting codes Q<0:3> are generated using the counter section 130 in this way, a size of a circuit may decrease.

The comparison section 140 is configured to output the period control signal QSSETP when the counting codes Q<0:3> reach a certain value. For reference, the comparison section 140 may be configured to compare the counting codes Q<0:3> and applied configuration codes, and activate the period control signal QSSETP when the counting codes Q<0:3> are the same as the configuration codes. This configuration can control an activation timing of the period control signal QSSETP through the configuration codes. This example may be applied to the semiconductor memory apparatus in accordance with the exemplary embodiment shown in FIG. 5 which includes the configuration code output unit 600A. In this case, the period control signal generation unit 100 may be configured as FIG. 6B, i.e., the comparison section 140 may be configured to receive the configuration codes SCODE<N:1>.

The latch reset pulse generation section 150 is configured to delay the period control signal QSSETP by a certain time and output the latch reset pulse signal RSTP. The latch reset pulse generation section 150 may include a delay stage, and a delay value of the delay stage may be set to satisfy a timing margin to be secured.

Hereafter, a detailed configuration of the period control signal generation unit 100 will be described.

Figure 7:
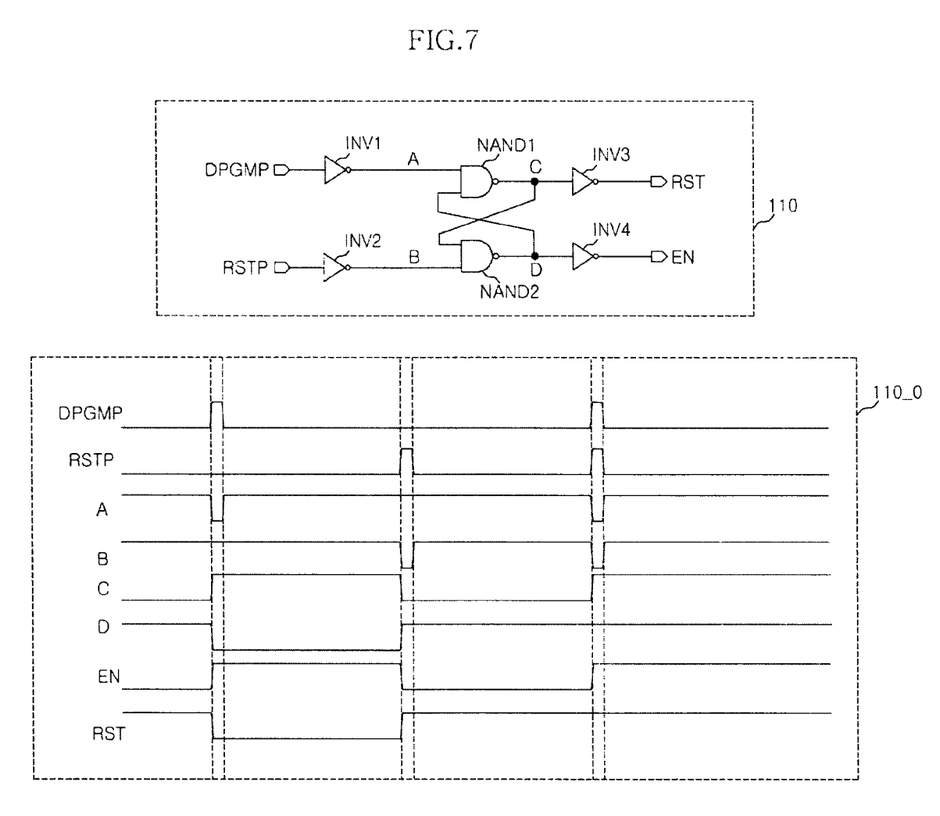
FIG. 7 is an exemplary configuration diagram of an input latch section of the period control signal generation unit shown in FIG. 6 and a timing diagram illustrating internal operations of the input latch section.

FIG. 7 is a configuration diagram of the input latch section of the period control signal generation unit shown in FIG. 6 and a timing diagram illustrating internal operations of the input latch section.

Referring to FIG. 7, the input latch section 110 includes an RS latch which is composed of a plurality of NAND gates NAND1 and NAND2. Referring to a timing diagram 110_0, in the input latch section 110, the count enable signal EN is activated to the high level when the programming enable signal DPGMP pulses to the high level, and the counter reset signal RST is activated to the high level when the latch reset pulse signal RSTP pulses to the high level.

Figure 8:
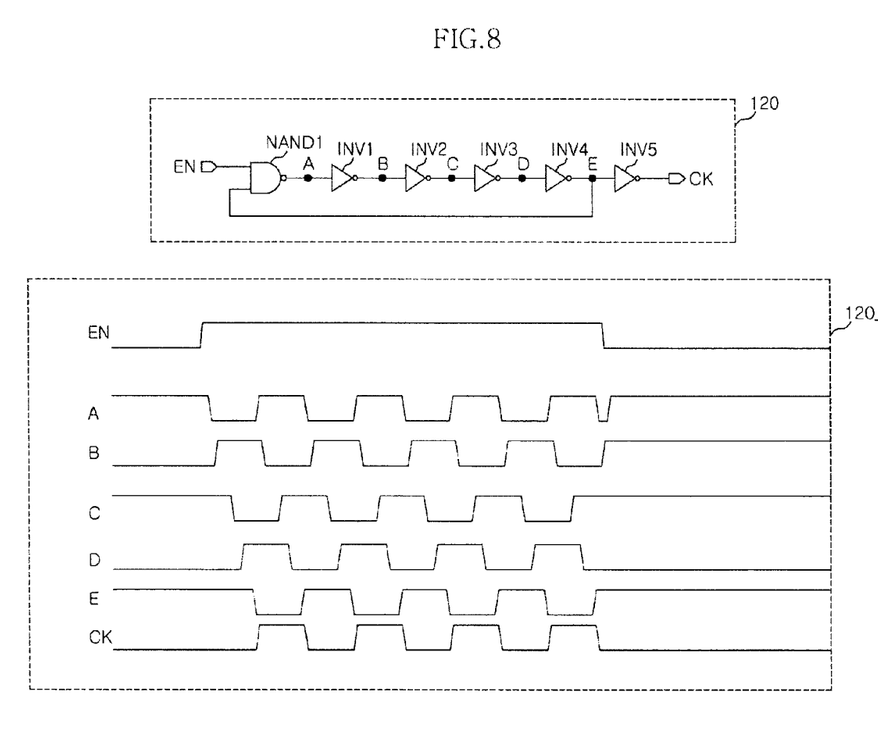
FIG. 8 is an exemplary configuration diagram of a clock generation section of the period control signal generation unit shown in FIG. 6 and a timing diagram illustrating internal operations of the clock generation section.

FIG. 8 is a configuration diagram of the clock generation section of the period control signal generation unit shown in FIG. 6 and a timing diagram illustrating internal operations of the clock generation section.

Referring to FIG. 8, the clock generation section 120 includes a ring oscillator which is composed of a NAND gate NAND1 and a plurality of inverters INV1 through INV5. Referring to a timing diagram 120_0, the clock generation section 120 outputs the clock signal CK which toggles while the count enable signal EN is activated to the high level.

Figure 9:
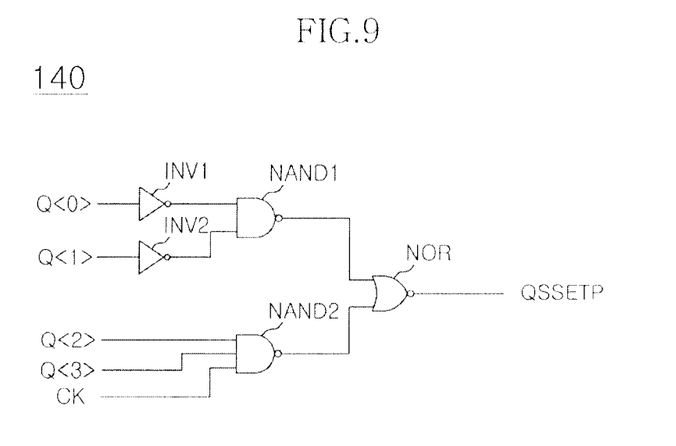
FIG. 9 is an exemplary configuration diagram of a comparison section of the period control signal generation unit shown in FIG. 6.

FIG. 9 is a configuration diagram of the comparison section of the period control signal generation unit shown in FIG. 6.

Referring to FIG. 9, the comparison section 140 includes a first inverter INV1 which receives the first counting code Q<0>, a second inverter INV2 which receives the second counting code Q<1>, a first NAND gate NAND1 which receives output signals of the first inverter INV1 and the second inverter INV2, a second NAND gate NAND2 which receives the third counting code Q<2>, the fourth counting code Q<3> and the clock signal CK, and a NOR gate NOR which receives signals outputted from the first and second NAND gates NAND1 and NAND2 and outputs the period control signal QSSETP. In the present exemplary embodiment, the comparison section 140 outputs the period control signal QSSETP in response to the clock signal CK when the first and second counting codes Q<0> and Q<1> are '0' and the third and fourth counting codes Q<2> and Q<3 are '1'.

Figure 10:
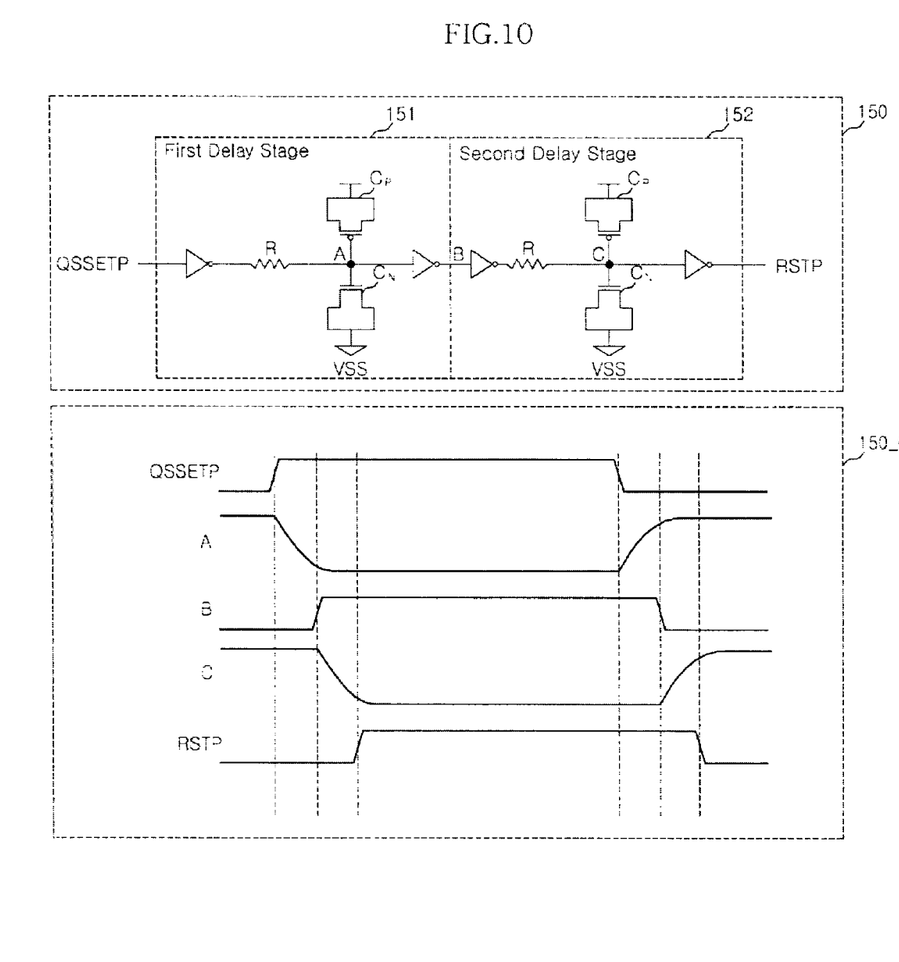
FIG. 10 is an exemplary configuration diagram of a reset pulse generation section of the period control signal generation unit shown in FIG. 6 and a timing diagram illustrating internal operations of the reset pulse generation section.

FIG. 10 is a configuration diagram of the latch reset pulse generation section of the period control signal generation unit shown in FIG. 6 and a timing diagram illustrating internal operations of the 1 reset pulse generation section.

Referring to FIG. 10, the latch reset pulse generation section 150 includes a first delay stage 151 which delays the period control signal QSSETP, and a second delay stage 152 which delays a signal outputted from the first delay stage 151 and outputs the latch reset pulse signal RSTP. Each of the first delay stage 151 and the second delay stage 152 is composed of a resistor R and MOS capacitors $C_P$ and $C_N$, and its delay value is determined depending on an RC time constant.

Figure 11:
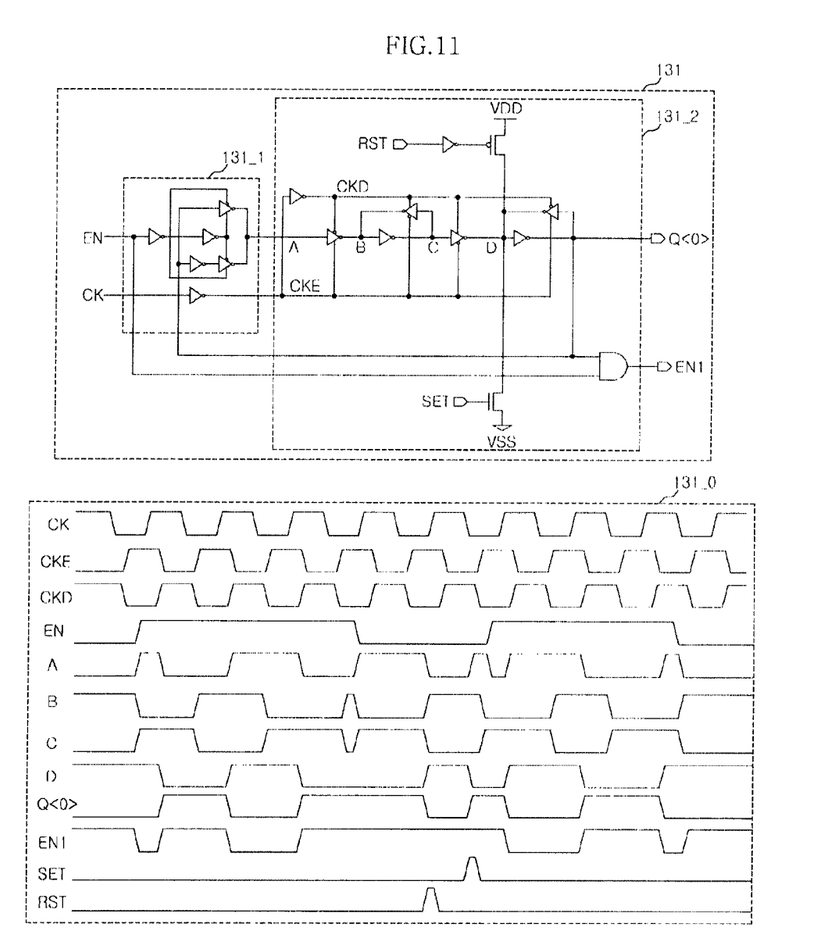
FIG. 11 is an exemplary configuration diagram of a counter section of the period control signal generation unit shown in FIG. 6 and a timing diagram illustrating internal operations of the counter section.

FIG. 11 is a configuration diagram of the counter section of the period control signal generation unit shown in FIG. 6 and a timing diagram illustrating internal operations of the counter section. FIG. 11 representatively shows a least significant 1 bit counter 131 among a plurality of 1 bit counters 131 through 134. The counter section 130 is configured to perform an up counting operation.

Referring to FIG. 11, the 1 bit counter 131 includes a signal input part 131_1 and a latch part 131_2.

The signal input part 131_1 determines a signal level of an input node A of the latch part 131_2 in response to the count enable signal EN and the first counting code Q<0>.

The latch part 131_2 latches a signal outputted from the signal input part 131_1 in response to the clock signal CK and outputs the first counting code Q<0> and a carry signal EN1. The carry signal EN1 is used as a count enable signal EN1 of the second 1 bit counter 132. An internal node of the latch part 131_2 is initialized or is changed to a specified level in response to the counter reset signal RST and a set signal SET.

Figure 12:
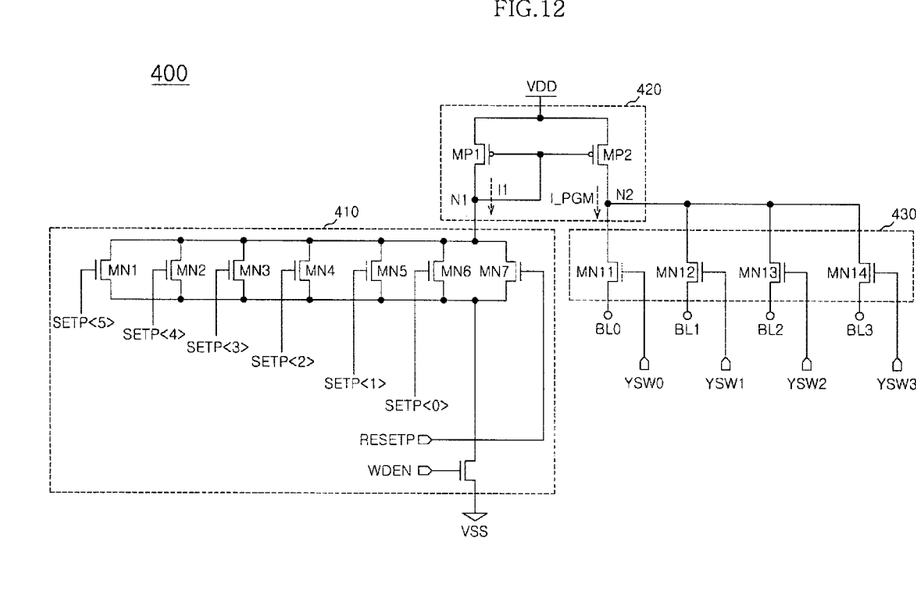
FIG. 12 is a configuration diagram illustrating an exemplary embodiment of a data write unit.

FIG. 12 is a configuration diagram illustrating an exemplary embodiment of a data write unit.

Referring to FIG. 12, the data write unit 400 includes a current control section 410, a current driving section 420 and a selection section 430.

The current control section 410 is configured to control a first current I1 according to a code combination of the first write control codes SETP<N:0> and the second write control code RESETP when a write enable signal WDEN is activated. Here, a plurality of NMOS transistors MN1 through MN6, which are controlled by the first write control codes SETP<N:0>, are selectively turned on in response to the code combination of the first write control codes SETP<N:0>. Therefore, the first current is controlled depending on the a code combination of the first write control codes SETP<N:0> and the second write control code RESETP. According to an example, the first write control codes SETP<N:0> are signals which are cyclically updated, and the second write control code RESETP is a signal which may be inputted in a pulse type.

The current driving section 420 is configured to drive a programming current pulse I_PGM corresponding to the first current I1, to an output terminal N2. According to this exemplary embodiment, the current driving section 420 is configured to drive a programming current pulse I_PGM equal to the first current I1. The programming current pulse I_PGM may be classified into a first programming current pulse (i.e., "set" programming current pulse) corresponding to the first write control codes SETP<N:0> and a second programming current pulse (i.e., "reset" programming current pulse) corresponding to the second write control code RESETP.

The selection section 430 is configured to output the programming current pulse I_PGM driven from the current driving section 420 to bit lines BL0 through BL3 which respectively respond to a plurality of select signals YSW<0:3>.

Figure 13:
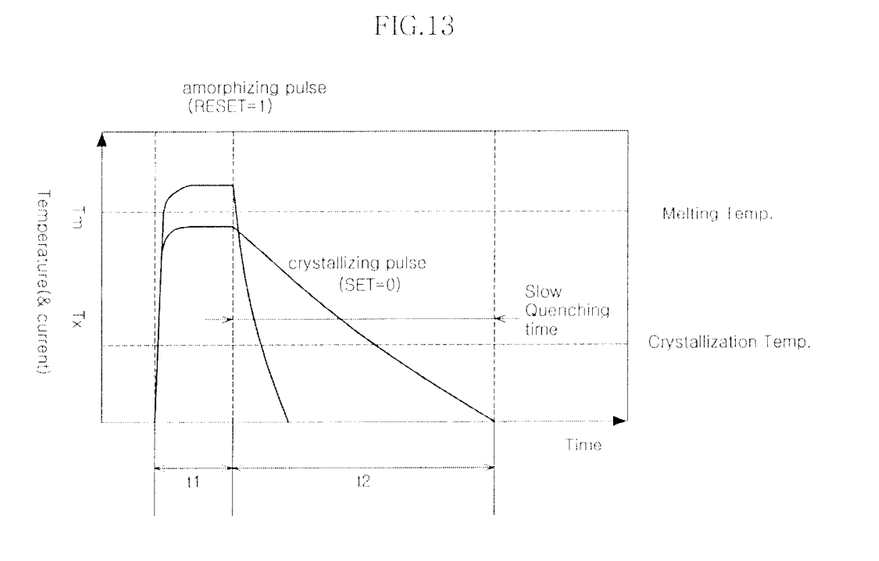
FIG. 13 is a graph showing programming current pulses outputted from the data write unit shown in FIG. 12.

FIG. 13 is a graph showing programming current pulses outputted from the data write unit shown in FIG. 12.

Referring to FIG. 13, the second programming current pulse is driven to be higher than a melting temperature for a short time, and the first programming current pulse is driven to be close to the melting temperature for an initial first pulse time t1 and gradually decrease for a second pulse time t2. For reference, in the graph, the second programming current pulse is shown as an amorphizing pulse, and the first programming current pulse is shown as a crystallizing pulse.

As described in the exemplary embodiment, by controlling a pulsing timing of the period control signal QSSETP, the driving time t1 of the initial first programming current pulse I_PGM can be controlled. That is to say, by controlling the driving time t1 of the initial first programming current pulse I_PGM, crystallization characteristics of a memory cell may be changed.

As is apparent from the above embodiments, by using the counter section to control an activation timing of the period control signal QSSETP, the size of a circuit may decrease. Also, by controlling the time t1 of a first pulse interval of the first programming current pulse, a programming operation can be performed precisely. The time t1 of the first pulse interval may be set to be a fixed time as in the exemplary embodiment shown in FIG. 4 or may be set to be controlled through the configuration codes SCODE<N:1> as in the embodiment shown in FIG. 5.

So far, exemplary embodiments of the present invention have been described in detail. For reference, embodiments including additional component elements, which are not directly associated with the spirit of the present invention, may be exemplified in order to describe the present invention in further detail. Moreover, an active high configuration or an active low configuration for indicating the activated states of signals and circuits may vary depending upon an embodiment. Also, while the bit number of first write control codes is limited to clearly explain the technical spirit of the present invention, it is to be understood that the bit number can be changed depending upon an embodiment. Since such embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
 a period control signal generation unit configured to generate a period control signal which is activated after a first time, in response to a programming enable signal;
 a first write control code generation unit configured to generate first write control codes which are cyclically updated for a second time, in response to the programming enable signal, and update the first write control codes in response to the period control signal;
 a second write control code generation unit configured to generate a second write control code in response to the programming enable signal; and
 a data write unit configured to output a first programming current pulse which has a magnitude corresponding to a code combination of the updated first write control codes or a second programming current pulse which has a magnitude corresponding to the second write control code.

2. The semiconductor memory apparatus according to claim 1, wherein the first write control codes are cyclically updated for a time longer than an activation time of the second write control code.

3. The semiconductor memory apparatus according to claim 1, wherein the first programming current pulse maintains a current value for the first time, and gradually decreases in current value for the second time after the first time.

4. The semiconductor memory apparatus according to claim 1, wherein the period control signal generation unit comprises:
 an input latch section configured to output a count enable signal and a reset signal in response to the programming enable signal and a reset pulse signal;
 a clock generation section configured to generate a clock signal in response to the count enable signal;
 a counter section configured to output counting codes which are counted under the control of the count enable signal, the reset signal and the clock signal;
 a comparison section configured to activate and output the period control signal when the counting codes reach a predetermined value; and
 a latch reset pulse generation section configured to delay the period control signal and output the latch reset pulse signal.

5. The semiconductor memory apparatus according to claim 1, wherein the data write unit comprises:
 a current control section configured to control a current according to a code combination of the first write control codes and the second write control code; and
 a current driving section configured to drive the first programming current pulse or the second programming current pulse, with a magnitude corresponding to the current.

6. The semiconductor memory apparatus according to claim 5, wherein the data write unit further comprises:
 a selection section configured to output the programming current pulse driven from the current driving section to bit lines which respectively correspond to a plurality of select signals.

7. A semiconductor memory apparatus comprising:
 a configuration code output unit configured to output configuration codes;
 a period control signal generation unit configured to generate a period control signal which is activated after a first time corresponding to the configuration codes, in response to a programming enable signal;
 a first write control code generation unit configured to generate first write control codes which are cyclically updated for a second time, in response to the programming enable signal, and update the first write control codes in response to the period control signal;
 a second write control code generation unit configured to generate a second write control code in response to the programming enable signal; and
 a data write unit configured to output a first programming current pulse which has a magnitude corresponding to a code combination of the updated first write control codes or a second programming current pulse which has a magnitude corresponding to the second write control code.

8. The semiconductor memory apparatus according to claim 7, wherein the first write control codes are cyclically updated for a time longer than an activation time of the second write control code.

9. The semiconductor memory apparatus according to claim 7, wherein the first programming current pulse maintains a current value for the first time, and gradually decreases in current value for the second time after the first time.

10. The semiconductor memory apparatus according to claim 7, wherein the period control signal generation unit comprises:
- an input latch section configured to output a count enable signal and a reset signal in response to the programming enable signal and a reset pulse signal;
- a clock generation section configured to generate a clock signal in response to the count enable signal;
- a counter section configured to output counting codes which are counted under the control of the count enable signal, the reset signal and the clock signal;
- a comparison section configured to compare the counting codes and the configuration codes, and activate and output the period control signal according to a comparison result; and
- a latch reset pulse generation section configured to delay the period control signal and output the latch reset pulse signal.

11. The semiconductor memory apparatus according to claim 7, wherein the data write unit comprises:
- a current control section configured to control a current according to a code combination of the first write control codes and the second write control code; and
- a current driving section configured to drive the first programming current pulse or the second programming current pulse, with a magnitude corresponding to the current.

12. The semiconductor memory apparatus according to claim 11, wherein the data write unit further comprises:
- a selection section configured to output the programming current pulse driven from the current driving section to bit lines which respectively correspond to a plurality of select signals.

13. The semiconductor memory apparatus according to claim 7, wherein the configuration code output unit comprises:
- a latch section configured to store the configuration codes.

14. The semiconductor memory apparatus according to claim 7, wherein the configuration codes are signals which are outputted from a mode register set.

15. A semiconductor memory apparatus comprising:
- a data write unit configured to output a first programming current which has a first period of supplying the largest first programming current, and a second period of supplying a decreasing first programming current;
- a period control signal generation unit configured to generate a period control signal which control a duration of the first period;
- a first write control code generation unit configured to generate a first programming control code which control the first programming current; and
- a configuration code output unit configured to output a configuration code to be compared with an internal code of the period control signal generation unit.

16. The semiconductor memory apparatus according to claim 15, wherein the internal code of the period control signal generation unit is an output of a counter logic in the period control signal generation unit.

* * * * *